United States Patent
Rouh et al.

(10) Patent No.: US 9,553,159 B2
(45) Date of Patent: Jan. 24, 2017

(54) SEMICONDUCTOR DEVICES HAVING POLYSILICON GATE PATTERNS AND METHODS OF FABRICATING THE SAME

(71) Applicant: SK hynix Inc., Icheon-si Gyeonggi-do (KR)

(72) Inventors: Kyong Bong Rouh, Icheon-si Gyeonggi-do (KR); Yong Seok Eun, Seongnam-si Gyeonggi-do (KR); Young Jin Son, Seoul (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/930,890

(22) Filed: Nov. 3, 2015

(65) Prior Publication Data
US 2016/0056258 A1 Feb. 25, 2016

Related U.S. Application Data

(63) Continuation of application No. 13/615,312, filed on Sep. 13, 2012.

(30) Foreign Application Priority Data

Dec. 23, 2011 (KR) .......................... 10-2011-0141640

(51) Int. Cl.
H01L 29/78 (2006.01)
H01L 29/49 (2006.01)
H01L 21/28 (2006.01)

(52) U.S. Cl.
CPC ..... *H01L 29/4941* (2013.01); *H01L 21/28035* (2013.01); *H01L 29/4925* (2013.01)

(58) Field of Classification Search
CPC .................................................. H01L 29/4925
USPC ........................................................ 257/412
See application file for complete search history.

(56) References Cited

U.S. PATENT DOCUMENTS 5,837,598 A * 11/1998 Aronowitz .......... H01L 29/4916
257/E21.197
2005/0127446 A1* 6/2005 Nakanishi ......... H01L 21/28035
257/358

* cited by examiner

*Primary Examiner* — Hsin-Yi Hsieh
(74) *Attorney, Agent, or Firm* — William Park & Associates Ltd.

(57) ABSTRACT

A semiconductor device including a gate insulation pattern on a substrate, and a semiconductor gate pattern including an amorphous silicon pattern and a polycrystalline silicon pattern stacked on a side of the gate insulation pattern opposite to the substrate. The amorphous silicon pattern includes anti-diffusion impurities that suppress diffusion of impurity ions in the semiconductor gate pattern.

4 Claims, 9 Drawing Sheets

SEMICONDUCTOR DEVICES HAVING POLYSILICON GATE PATTERNS AND METHODS OF FABRICATING THE SAME

CROSS-REFERENCES TO RELATED APPLICATIONS

The present application is a Continuation of U.S. application Ser. No. 13/615,312, filed on Sep. 13, 2012, and the present application claims priority under 35 U.S.C 119(a) to Korean Application No. 10-2011-0141640, filed on Dec. 23, 2011, in the Korean intellectual property Office, which is incorporated herein by reference in its entirety as set forth in full.

BACKGROUND

Field of the Invention

Embodiments of the present disclosure relate to semiconductor devices and methods of fabricating the same and, more particularly, to semiconductor devices having polysilicon gate patterns and methods of fabricating the same.

Description of the Related Art

In general, semiconductor devices employ metal-oxide-semiconductor (MOS) transistors as active elements to reduce power consumption. Further, semiconductor devices may employ resistors and/or capacitors as passive elements together with the MOS transistors. The MOS transistors can be typically categorized as either N-channel MOS transistors or P-channel MOS transistors according to a conductivity type of inversion channel regions thereof. In some application fields of the MOS transistors, a metal layer has been used as gate electrode materials of the MOS transistors. However, in some other application fields of the MOS transistors, a polysilicon layer has been widely used as the gate electrode material of the MOS transistors.

SUMMARY

Embodiments are directed to semiconductor devices having polysilicon gate patterns and methods of fabricating the same.

According to some embodiments, a semiconductor device includes a gate insulation pattern on a substrate and a semiconductor gate pattern on a side of the gate insulation pattern opposite to the substrate. The semiconductor gate pattern includes an amorphous silicon pattern and a polycrystalline silicon pattern. The amorphous silicon pattern includes anti-diffusion impurities that suppress diffusion of impurity ions in the semiconductor gate pattern.

A thickness of the amorphous silicon pattern may be equal to or less than one third a thickness of the semiconductor gate pattern.

The amorphous silicon pattern may be disposed between the gate insulation pattern and the polycrystalline silicon pattern.

The anti-diffusion impurities may include nitrogen atoms, carbon atoms or oxygen atoms.

The semiconductor gate pattern may have a thickness which is equal to or less than about 1000 angstroms (Å). The amorphous silicon pattern may have a thickness which is less than or equal to 200 angstroms (Å).

According to another embodiment, a semiconductor device includes a gate insulation pattern on a substrate and a semiconductor gate pattern on a side of the gate insulation pattern opposite to the substrate. The semiconductor gate pattern includes an amorphous silicon pattern and a polycrystalline silicon pattern stacked on the gate insulation pattern. The amorphous silicon pattern has a maximum impurity ion concentration which is higher than an impurity ion concentration in a lower portion of the polycrystalline silicon pattern adjacent to the amorphous silicon pattern.

The maximum impurity ion concentration of the amorphous silicon pattern may be at least fifty times greater than the impurity ion concentration in the lower portion of the polycrystalline silicon pattern adjacent to the amorphous silicon pattern.

According to another embodiment, a method of fabricating a semiconductor device includes forming a gate insulation layer on a substrate, forming a first amorphous silicon layer doped with anti-diffusion impurities on a side of the gate insulation layer opposite to the substrate, forming a second amorphous silicon layer on a side of the first amorphous silicon layer opposite to the gate insulation layer, and selectively crystallizing the second amorphous silicon layer to form a polycrystalline silicon layer. The first amorphous silicon layer is doped with the anti-diffusion impurities and the polycrystalline silicon layer constitutes a semiconductor gate layer.

The anti-diffusion impurities may suppress crystallization of the first amorphous silicon layer and the second amorphous silicon layer is selectively crystallized.

The anti-diffusion impurities may be injected into the first amorphous silicon layer during formation of the first amorphous silicon layer.

The anti-diffusion impurities may be injected into the first amorphous silicon layer after deposition of the first amorphous silicon layer.

The first amorphous silicon layer may be formed to a thickness which is equal to or less than one third a thickness of the semiconductor gate layer.

The anti-diffusion impurities may include nitrogen atoms, carbon atoms or oxygen atoms.

The second amorphous silicon layer may be selectively crystallized using a rapid thermal annealing process. The rapid thermal annealing process may be performed at a temperature of about 800° C. to about 1000° C.

The method may further include injecting impurity ions into the semiconductor gate layer after the second amorphous silicon layer is selectively crystallized. The method may further include annealing the semiconductor gate layer at a temperature of about 800° C. to about 1000° C. to activate the impurity ions in the semiconductor gate layer after the impurity ions are injected into the semiconductor gate layer. The method may further include patterning the semiconductor gate layer and the gate insulation layer to form a gate insulation pattern, a first amorphous silicon pattern and a polycrystalline silicon pattern sequentially stacked on the substrate after the impurity ions in the semiconductor gate layer are activated. The polycrystalline silicon pattern may be formed using a first etching process, and the first amorphous silicon pattern may be formed using a second etching process. The second etching process may be performed using an etch recipe that exhibits less etch damage than the first etching process. The second etching process may be performed such that etch damage applied to the substrate is minimized.

BRIEF DESCRIPTION OF THE DRAWINGS

Embodiments of the inventive concept will become more apparent in view of the attached drawings and accompanying detailed description.

DETAILED DESCRIPTION OF THE EMBODIMENTS

Figure 1:
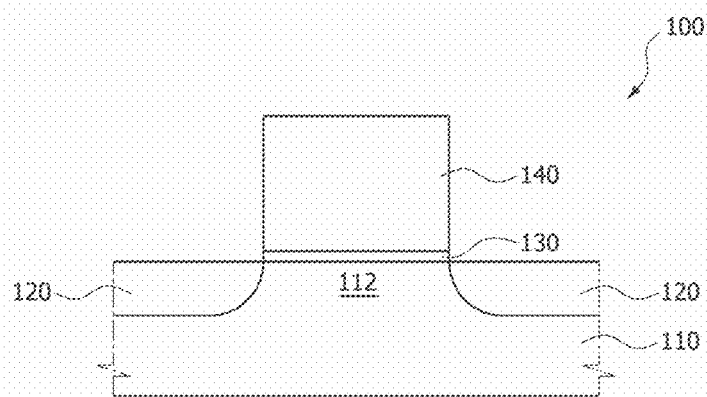
FIG. 1 is a cross sectional view illustrating an example of MOS transistors having polysilicon gate patterns.

Example embodiments are described below with reference to the accompanying drawings. Many different forms and embodiments are possible without deviating from the spirit and teachings of this disclosure and so the disclosure should not be construed as limited to the example embodiments set forth herein. Rather, these embodiments are provided so that this disclosure will be thorough, and convey a scope of the disclosure to those skilled in the art. In the drawings, the sizes and relative sizes of layers and regions may be exaggerated for clarity. The same reference numerals or the same reference designators denote the same elements throughout the specification.

Example embodiments are described herein with reference to cross-section illustrations that are schematic illustrations of embodiments (and intermediate structures). As such, variations from the shapes of the illustrations as a result, for example, of manufacturing techniques and/or tolerances, are to be expected. Thus, embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "has", "having", "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross sectional view illustrating an example MOS transistor having polysilicon gate patterns. Referring to FIG. 1, a pair of source/drain regions 120 may be disposed in a substrate 110, for example, a silicon substrate. The pair of source/drain regions 120 may be spaced apart from each other by a channel region 112 corresponding to a portion of the substrate 110. A gate insulation pattern 130 such as a silicon oxide pattern may be disposed on the channel region 112, and a polysilicon gate pattern 140 may be disposed on a side of the gate insulation pattern 130 opposite to the channel region 112. The polysilicon gate pattern 140 should have a sufficiently high conductivity in order that the polysilicon gate pattern 140 is used as a gate electrode. Thus, the polysilicon gate pattern 140 should be heavily doped with impurity ions to have a relatively high impurity concentration. The polysilicon gate pattern 140, the gate insulation pattern 130 and the source/drain regions 120 may constitute a MOS transistor 100.

N-type impurity ions, for example, phosphorus (P) ions or arsenic (As) ions have been widely used as impurity ions for doping the polysilicon gate pattern 140. However, if the MOS transistor 100 is a P-channel MOS transistor and the polysilicon gate pattern 140 is doped with N-type impurity ions, the P-channel MOS transistor may be formed to have a buried channel structure that causes an increase of channel leakage current. Thus, various technologies for doping the polysilicon gate patterns of the P-channel MOS transistors with P-type impurity ions, for example, boron ions have been proposed to obtain a surface channel structure of the P-channel MOS transistors.

If the MOS transistor 100 is a P-channel MOS transistor and the polysilicon gate pattern 140 is doped with P-type impurity ions such as boron ions, a lower portion of the polysilicon gate pattern 140 adjacent to the gate insulation pattern 130 may be insufficiently doped with the boron ions. In this case, an impurity depletion phenomenon may occur in the lower portion of the polysilicon gate pattern 140, thereby degrading electrical characteristics of the MOS transistor 100.

If the impurity ions are depleted in the lower portion of the polysilicon gate pattern 140, a portion of a gate voltage applied to the polysilicon gate pattern 140 may be applied to the impurity depletion region of the polysilicon gate pattern 140. Thus, a threshold voltage of the MOS transistor 100 may be increased. That is, the impurity depletion region of the polysilicon gate pattern 140 may cause the same effect as if the gate insulation pattern 130 were thicker. As a result, an on-current of the MOS transistor may be reduced.

When boron ions are implanted into the polysilicon gate pattern 140, an implantation energy of the boron ions may be increased to heavily dope the lower portion of the polysilicon gate pattern 140 with the boron ions. In this case, the boron ions in the lower portion of the polysilicon gate pattern 140 may be diffused into the channel region 112 through the gate insulation pattern 130 during the ion implantation process and/or a subsequent annealing process (also, referred to as a thermal treatment process) for activating the boron ions. This phenomenon may be referred to as a boron penetration phenomenon.

Figure 2:
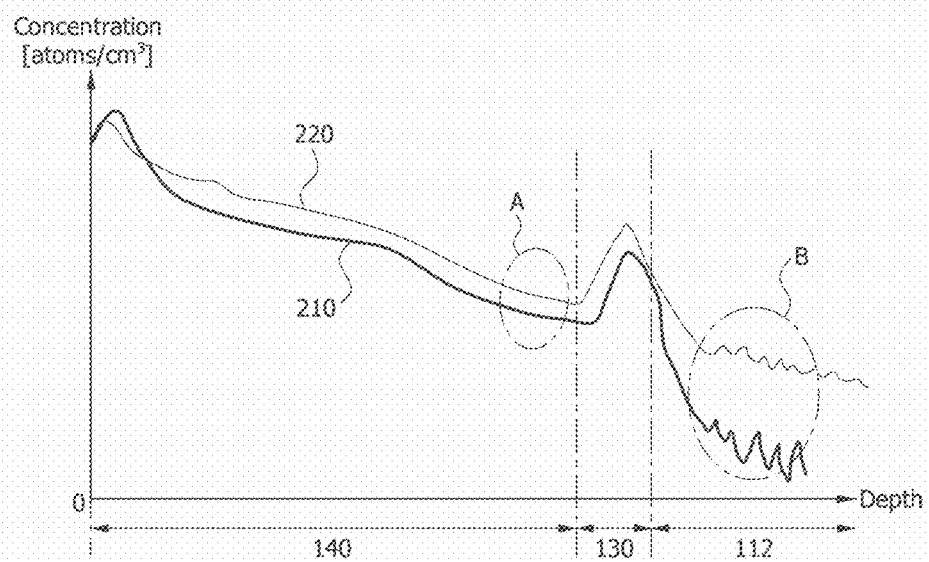
FIG. 2 is a graph illustrating a concentration profile of P-type impurity ions distributed in a polysilicon gate pattern, a gate insulation pattern and a channel region of the MOS transistor of FIG. 1.

FIG. 2 is a graph illustrating a concentration profile of P-type impurity ions distributed in a polysilicon gate pattern, a gate insulation pattern and a channel region of the MOS transistor of FIG. 1. In FIG. 2, a line indicated by the reference numeral 210 represents a boron concentration profile of the polysilicon gate pattern 140, the gate insulation pattern 130 and the channel region 112 constituting the MOS transistor 100 illustrated in FIG. 1 when a lower portion of the polysilicon gate pattern 140 has a relatively low boron concentration. In contrast, a line indicated by the reference numeral 220 represents a boron concentration profile in the polysilicon gate pattern 140, the gate insulation pattern 130 and the channel region 112 of the MOS transistor 100 illustrated in FIG. 1 when a lower portion of the polysilicon gate pattern 140 has a relatively high boron concentration.

As illustrated in a portion 'A' of FIG. 1, an impurity depletion phenomenon in the polysilicon gate pattern 140 may be suppressed when the lower portion of the polysilicon gate pattern 140 is heavily doped with boron ions (see the line 220), while an impurity depletion phenomenon in the polysilicon gate pattern 140 may more readily occur when the lower portion of the polysilicon gate pattern 140 is lightly doped with boron ions (see the line 210).

As illustrated in portion 'B' of FIG. 1, when the lower portion of the polysilicon gate pattern 140 is heavily doped with boron ions (see the line 220), the impurity depletion phenomenon in the polysilicon gate pattern 140 may be suppressed whereas a boron penetration phenomenon may occur to increase a boron concentration in the channel region 112. Thus, a threshold voltage of the MOS transistor 100 may unstably vary. As such, the impurity depletion phenomenon and the boron penetration phenomenon may have a trade-off relationship. As a thickness of the polysilicon gate pattern 140 is reduced, it may be more difficult to suppress both the impurity depletion phenomenon and the boron penetration phenomenon.

Figure 3:
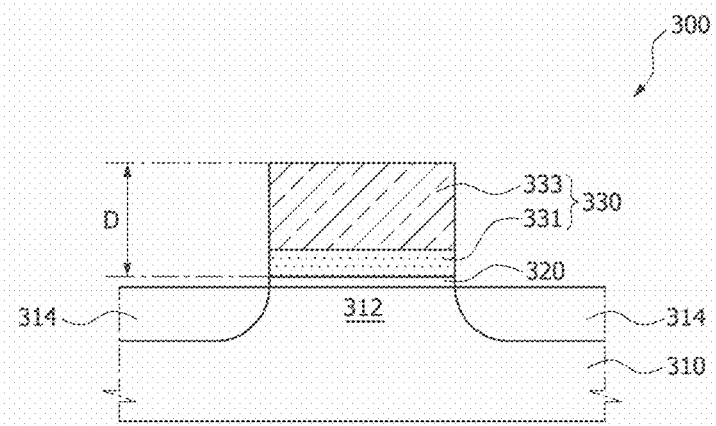
FIG. 3 is a cross sectional view illustrating a MOS transistor having a silicon gate pattern according to an embodiment.

FIG. 3 is a cross sectional view illustrating a MOS transistor having a silicon gate pattern according to an example embodiment. Referring to FIG. 3, a gate insulation pattern 320 may be disposed on a substrate 310. The substrate 310 may be a silicon substrate but is not limited thereto. For example, the substrate 310 may be a silicon-on-insulator (SOI) substrate. A pair of source/drain regions 314, for example, a pair of impurity regions, may be disposed in the substrate 310 to be spaced apart from each other. The substrate 310 between the pair of source/drain regions 314 may act as a channel region 312. The gate insulation pattern 320 may be disposed on the channel region 312. The gate insulation pattern 320 may include a silicon oxide layer or a high-k dielectric layer. A semiconductor gate pattern 330 may be disposed on a side of the gate insulation pattern 320 opposite to the channel region 312. If a gate voltage over a threshold voltage is applied to the semiconductor gate pattern 330, the channel region 312 may be converted to have an opposite conductivity type to the substrate 310. The substrate 310, the source/drain regions 314, the gate insulation pattern 320 and the semiconductor gate pattern 330 may constitute a semiconductor device 300, for example, a MOS transistor.

In an embodiment, the semiconductor gate pattern 330 may be a silicon gate pattern. For example, the semiconductor gate pattern 330 may be configured to include an amorphous silicon pattern 331 and a polycrystalline silicon pattern 333 which are sequentially stacked, such that the polycrystalline silicon pattern 333 is formed over the amorphous silicon pattern 331. A bottom surface of the amorphous silicon pattern 331 may directly contact a top surface of the gate insulation pattern 320, and a top surface of the amorphous silicon pattern 331 may directly contact a bottom surface of the polycrystalline silicon pattern 333. The amorphous silicon pattern 331 may be doped with anti-diffusion impurities. The anti-diffusion impurities may act as interstitial impurities that occupy voids between silicon atoms in the amorphous silicon pattern 331. Thus, the anti-diffusion impurities may have a meta-stable status. In an embodiment, the anti-diffusion impurities may include nitrogen atoms, carbon atoms or oxygen atoms. In contrast, the polycrystalline silicon pattern 333 may be partially crystallized. Thus, the polycrystalline silicon pattern 333 may be formed not including anti-diffusion impurities.

The semiconductor gate pattern 330 including the amorphous silicon pattern 331 and the polycrystalline silicon pattern 333 may have a thickness which is equal to or less than about 1000 angstroms (Å). In an embodiment, the semiconductor gate pattern 330 may have a thickness of about 600 angstroms (Å). The amorphous silicon pattern 331 may have a thickness that is less than or equal to approximately one third the thickness of the semiconductor gate pattern 330. For example, when the semiconductor gate pattern 330 has a thickness of about 600 angstroms (Å), the amorphous silicon pattern 331 may have a thickness of about 200 angstroms (Å) or less.

Figure 4:
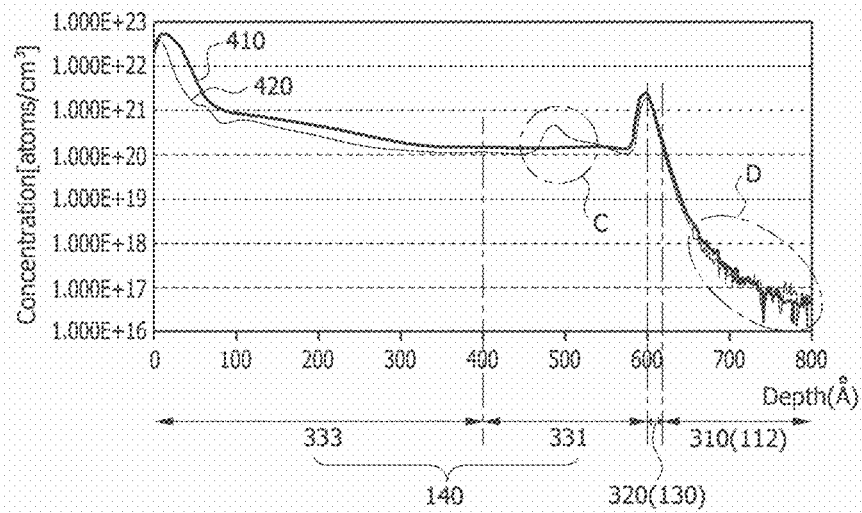
FIG. 4 is a graph illustrating concentration profiles of impurity ions distributed in the MOS transistors of FIGS. 1 and 3.

FIG. 4 is a graph illustrating a difference in concentration profiles of impurity ions distributed in the MOS transistors of FIGS. 1 and 3. In FIG. 4, a line indicated by the reference numeral 410 represents a concentration profile of impurity ions distributed in the polysilicon gate pattern 140, the gate insulation pattern 130 and the channel region 112 of the MOS transistor 100 illustrated in FIG. 1. A line indicated by the reference numeral 420 represents a concentration profile of impurity ions distributed in the semiconductor gate pattern 330, the gate insulation pattern 320 and the channel region 312 of the MOS transistor 300 illustrated in FIG. 3.

The concentration profiles 410 and 420 in a portion 'C' of FIG. 4 shows that when the gate pattern was formed of only the polysilicon gate pattern 140 (see the line 410), the impurity concentration (i.e., a boron concentration) of the polysilicon gate pattern 140 was approximately $1.5 \times 10^{20}$ atoms/cm$^3$ at a depth of approximately 500 angstroms (Å) from a top surface of the polysilicon gate pattern 140 (i.e., at a lower portion of the polysilicon gate pattern 140, spaced apart from the gate insulation pattern 130 by about 100 Å). In contrast, when the gate pattern was formed of the semiconductor gate pattern 330 including the amorphous silicon pattern 331 and the polycrystalline silicon pattern 333 (see the line 420), the impurity concentration (i.e., a boron concentration) of the semiconductor gate pattern 330 was approximately $3.49 \times 10^{20}$ atoms/cm$^3$ at a depth of about 500 angstroms (Å) from a top surface of the semiconductor gate pattern 330 (i.e., at approximately a mid portion of the amorphous silicon pattern 331, spaced apart from the gate insulation pattern 320 by approximately 100 Å). As such, if the semiconductor gate pattern 330 was formed to include the amorphous silicon pattern 331 containing anti-diffusion impurities, the impurity concentration of the amorphous silicon pattern 331 adjacent to the gate insulation pattern 320 was at least twice as high as compared with the MOS transistor illustrated in FIG. 1. Thus, the amorphous silicon pattern 331 may be configured to suppress diffusion of the impurity ions. As a result, according to the embodiment illustrated in FIG. 3, the impurity depletion phenomenon in the lower portion of the semiconductor gate pattern 330 can be suppressed.

In other embodiments, the semiconductor gate pattern 330 may be formed such that a maximum impurity concentration (e.g., boron concentration) of the amorphous silicon pattern 331 is at least fifty times greater than the impurity concentration (e.g., boron concentration) in the lower portion of the polycrystalline silicon pattern 333 adjacent to the amorphous silicon pattern 331.

As portion 'D' of FIG. 4 illustrates, even though the amorphous silicon pattern 331 of the MOS transistor 300 had a relatively high boron concentration of about $3.49 \times 10^{20}$ atoms/cm$^3$ at a mid portion of thereof, the boron concentration profile in the substrate 310 (e.g., the channel region 312) of the MOS transistor 300 was substantially equal to the boron concentration profile in the substrate 110 (e.g., the channel region 112) of the MOS transistor 100 when a lower portion of the polysilicon gate pattern 140 of FIG. 1 had a relatively low boron concentration. This shows that the embodiment illustrated in FIG. 3 can suppress the boron penetration phenomenon. That is, the anti-diffusion impurities in the amorphous silicon pattern 331 may gather the boron ions and, thus the boron ions are diffused only in a bulk region of the amorphous silicon pattern 331 even though a subsequent annealing process (also, referred to as a thermal treatment process) is performed. Consequently, the anti-diffusion impurities in the amorphous silicon pattern 331 may impede the boron ions in the semiconductor gate pattern 330 from diffusing into the gate insulation pattern 320 and the substrate 310.

Figure 5:
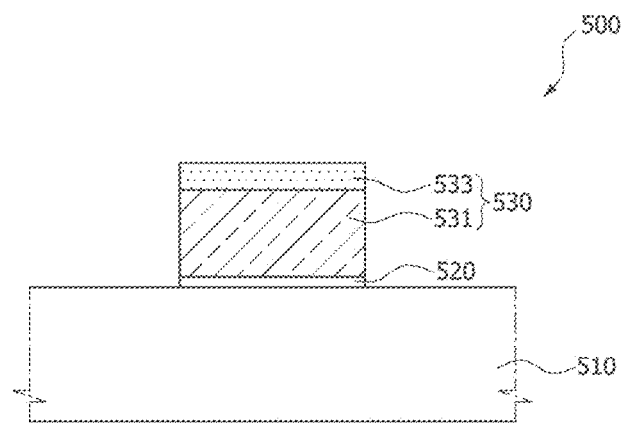
FIGS. 5, 6, 7 and 8 are cross sectional views illustrating MOS transistors having silicon gate patterns according to some example embodiments.

FIGS. 5, 6, 7 and 8 are cross sectional views illustrating MOS transistors having silicon gate patterns according to some example embodiments. Referring to FIG. 5, a semiconductor device 500 according to another embodiment, for example, a MOS transistor may be configured to include a substrate 510, a gate insulation pattern 520 disposed on the substrate 510, and a semiconductor gate pattern 530 disposed on a side of the gate insulation pattern 520 opposite to the substrate 510. The semiconductor gate pattern 530 may be a silicon gate pattern. For example, the semiconductor gate pattern 530 may include a polycrystalline silicon pattern 531 and an amorphous silicon pattern 533 which are sequentially stacked on a side of the gate insulation pattern 520 opposite to the substrate 510.

A bottom surface of the polycrystalline silicon pattern 531 may directly contact a top surface of the gate insulation pattern 520, and a top surface of the polycrystalline silicon pattern 531 may directly contact a bottom surface of the amorphous silicon pattern 533. The amorphous silicon pattern 533 may be doped with anti-diffusion impurities, and the anti-diffusion impurities may act as interstitial impurities that occupy voids between silicon atoms in the amorphous silicon pattern 331. Thus, the anti-diffusion impurities may have a meta-stable status. In an embodiment, the anti-diffusion impurities may include nitrogen atoms, carbon atoms or oxygen atoms. In contrast, the polycrystalline silicon pattern 333 may have a partially crystallized structure. Thus, the polycrystalline silicon pattern 333 may be formed not including the anti-diffusion impurities.

Figure 6:
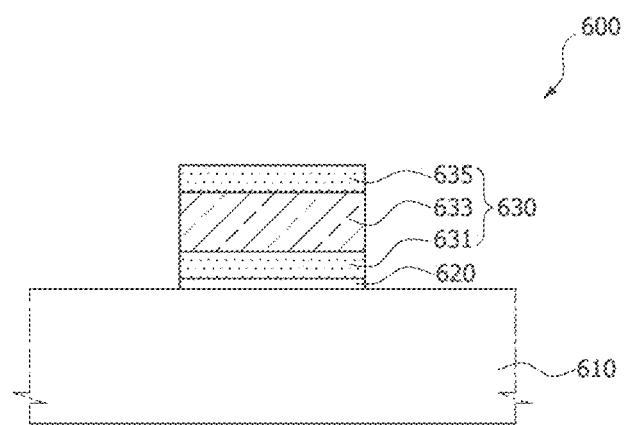

Referring to FIG. 6, a semiconductor device 600 according to another embodiment, for example, a MOS transistor may be configured to include a substrate 610, a gate insulation pattern 620 disposed on the substrate 610, and a semiconductor gate pattern 630 disposed on a side of the gate insulation pattern 620 opposite to the substrate 610. The semiconductor gate pattern 630 may be a silicon gate pattern. For example, the semiconductor gate pattern 630 may include a first amorphous silicon pattern 631, a polycrystalline silicon pattern 633 and a second amorphous silicon pattern 635 which are sequentially stacked on a side of the gate insulation pattern 620 opposite to the substrate 610.

A bottom surface of the first amorphous silicon pattern 631 may directly contact a top surface of the gate insulation pattern 620, and a top surface of the first amorphous silicon pattern 631 may directly contact a bottom surface of the polycrystalline silicon pattern 633. A top surface of the polycrystalline silicon pattern 633 may directly contact a bottom surface of the second amorphous silicon pattern 635. At least one of the first and second amorphous silicon patterns 631 and 635 may be doped with anti-diffusion impurities. In an embodiment, the anti-diffusion impurities may include nitrogen atoms, carbon atoms or oxygen atoms.

Figure 7:
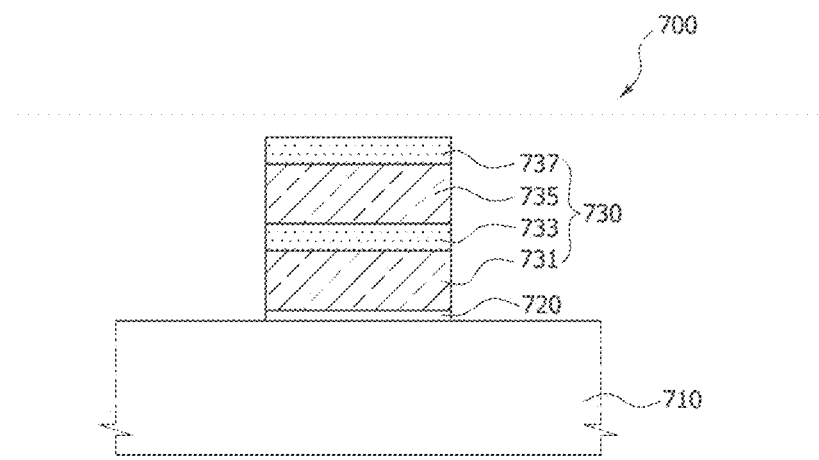

Referring to FIG. 7, a semiconductor device 700 according to another embodiment, for example, a MOS transistor may be configured to include a substrate 710, a gate insulation pattern 720 disposed on the substrate 710, and a semiconductor gate pattern 730 disposed on a side of the gate insulation pattern 720 opposite to the substrate 710. The semiconductor gate pattern 730 may be a silicon gate pattern. For example, the semiconductor gate pattern 730 may include a first polycrystalline silicon pattern 731, a first amorphous silicon pattern 733, a second polycrystalline silicon pattern 735 and a second amorphous silicon pattern 737 which are sequentially stacked on a side of the gate insulation pattern 720 opposite to the substrate 710.

The first and second polycrystalline silicon pattern 731 and 735, and the first and second amorphous silicon patterns 733 and 737, may be alternately stacked on the gate insulation pattern over a substrate, such that a bottom surface of the first polycrystalline silicon pattern 731 may directly contact a top surface of the gate insulation pattern 720, and a top surface of the first polycrystalline silicon pattern 731 may directly contact a bottom surface of the first amorphous silicon pattern 733. A top surface of the first amorphous silicon pattern 733 may directly contact a bottom surface of the second polycrystalline silicon pattern 735, and a top surface of the second polycrystalline silicon pattern 735 may directly contact a bottom surface of the second amorphous silicon pattern 737. At least one of the first and second amorphous silicon patterns 733 and 737 may be doped with anti-diffusion impurities. In an embodiment, the anti-diffusion impurities may include nitrogen atoms, carbon atoms or oxygen atoms.

Figure 8:
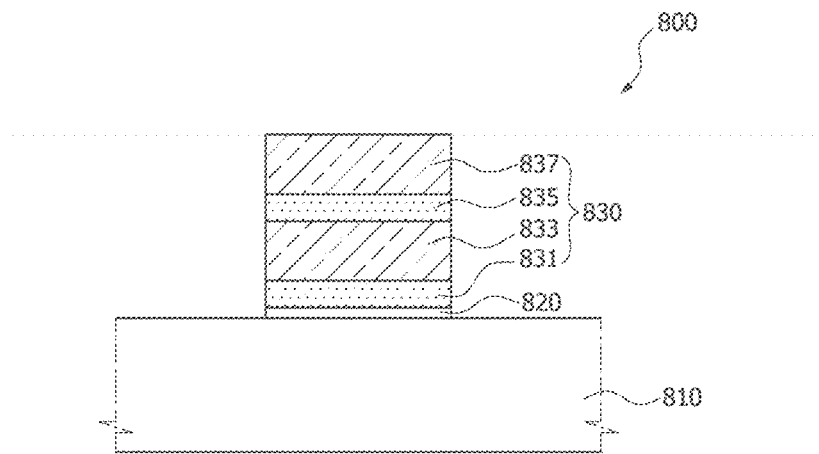

Referring to FIG. 8, a semiconductor device 800 according to another embodiment, for example, a MOS transistor may be configured to include a substrate 810, a gate insulation pattern 820 disposed on the substrate 810, and a semiconductor gate pattern 830 disposed on a side the gate insulation pattern 820 opposite to the substrate 810. The semiconductor gate pattern 830 may be a silicon gate pattern. For example, the semiconductor gate pattern 830 may include a first amorphous silicon pattern 831, a first polycrystalline silicon pattern 833, a second amorphous silicon pattern 835 and a second polycrystalline silicon pattern 837 which are sequentially stacked on a side of the gate insulation pattern 820 opposite to the substrate 810.

A bottom surface of the first amorphous silicon pattern 831 may directly contact a top surface of the gate insulation pattern 820, and a top surface of the first amorphous silicon pattern 831 may directly contact a bottom surface of the first polycrystalline silicon pattern 833. A top surface of the first polycrystalline silicon pattern 833 may directly contact a bottom surface of the second amorphous silicon pattern 835, and a top surface of the second amorphous silicon pattern 835 may directly contact a bottom surface of the second polycrystalline silicon pattern 837. At least one of the first and second amorphous silicon patterns 831 and 835 may be doped with anti-diffusion impurities. In an embodiment, the anti-diffusion impurities may include nitrogen atoms, carbon atoms or oxygen atoms.

Figure 9:
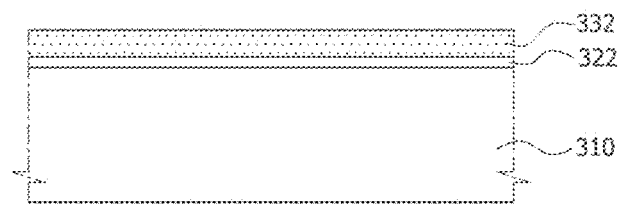
FIGS. 9 to 17 are cross sectional views illustrating methods of fabricating a MOS transistor of FIG. 3.

FIGS. 9 to 17 are cross sectional views illustrating methods of fabricating a MOS transistor of FIG. 3. Referring to FIG. 9, a gate insulation layer 322 may be formed on a substrate 310. The substrate 310 may be a silicon substrate but is not limited thereto. For example, the substrate 310 may be a silicon-on-insulator (SOI) substrate. The gate insulation layer 322 may be formed to include a silicon oxide layer or a high-k dielectric layer. After formation of the gate insulation layer 322, a cleaning process such as a wet cleaning process may be applied to a surface of the gate insulation layer 322. A first amorphous silicon layer 332 may be formed on the cleaned gate insulation layer 322. The first amorphous silicon layer 332 may be formed to have a thickness of about 200 angstroms (Å) or less. The first amorphous silicon layer 332 may be formed using a typical deposition process, for example, a chemical vapor deposition (CVD) process. During the CVD process for forming the first amorphous silicon layer 332, a dopant gas for doping the first amorphous silicon layer 332 with anti-diffusion impurities in addition to a source gas for depositing the first amorphous silicon layer 332 may be supplied into a process chamber. A nitrogen gas may be used as the dopant gas for doping the first amorphous silicon layer 332 with the anti-diffusion impurities. In other embodiments, a carbon gas or an oxygen gas may be used as the dopant gas for doping the first amorphous silicon layer 332 with the anti-diffusion impurities. When the first amorphous silicon layer 332 is formed to a thickness of about 200 angstroms (Å), the dopant gas may be introduced into the process chamber at a flow rate of about 1 standard cubic centimeter per minute (sccm) to 5 sccm. The anti-diffusion impurities may suppress diffusion of carrier impurities such as boron ions into the first amorphous silicon layer 332 during a subsequent annealing process. Further, the anti-diffusion impurities may suppress crystallization of the first amorphous silicon layer 332 during a subsequent annealing process. In other embodiments, after formation of the first amorphous silicon layer 332, the anti-diffusion impurities may be then injected into the first amorphous silicon layer 332.

Figure 10:
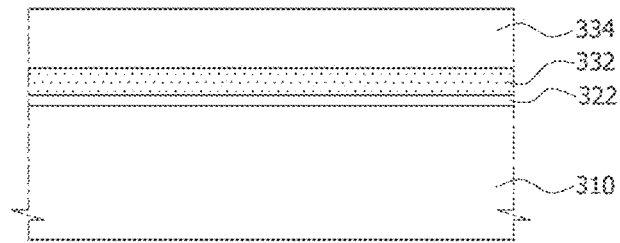

Referring to FIG. 10, a second amorphous silicon layer 334 may be formed on a side of the first amorphous silicon layer 332 opposite to the gate insulation layer 322. The second amorphous silicon layer 334 may be formed to a thickness of about 200 angstroms (Å) to 600 angstroms (Å) without injection of the anti-diffusion impurities. The second amorphous silicon layer 334 may be formed using a typical deposition process, for example, a chemical vapor deposition (CVD) process. In an embodiment, the first and second amorphous silicon layers 332 and 334 may be formed using an in-situ process. That is, the first and second amorphous silicon layers 332 and 334 may be successively formed in the same process chamber without a vacuum break. In the event that the first and second amorphous silicon layers 332 and 334 are formed using an in-situ process, the anti-diffusion impurities may be supplied into the process chamber only during formation of the first amorphous silicon layer 332.

Figure 11:
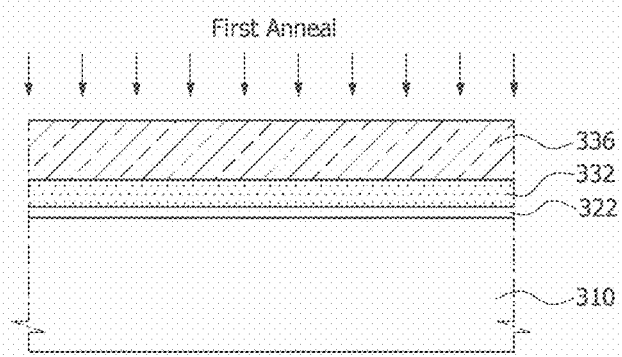

Referring to FIG. 11, the second amorphous silicon layer (334 of FIG. 10) may be selectively crystallized to form a polycrystalline silicon layer 336. As a result, a semiconductor gate layer including the first amorphous silicon layer 332 and the polycrystalline silicon layer 336 may be formed on the gate insulation layer 322. The selective crystallization of the second amorphous silicon layer (334 of FIG. 10) may be achieved by applying a first annealing process to the substrate including the first amorphous silicon layer 332 and the second amorphous silicon layer (334 of FIG. 10). In an embodiment, the first annealing process may be performed using a rapid thermal annealing process. The rapid thermal annealing process may be performed at a temperature of about 800° C. to about 1000° C. During the first annealing process, the second amorphous silicon layer (334 of FIG. 10) may be crystallized but the first amorphous silicon layer 332 may be formed without being crystallized because of the presence of the anti-diffusion impurities therein. The anti-diffusion impurities may have a meta-stable status.

Figure 12:
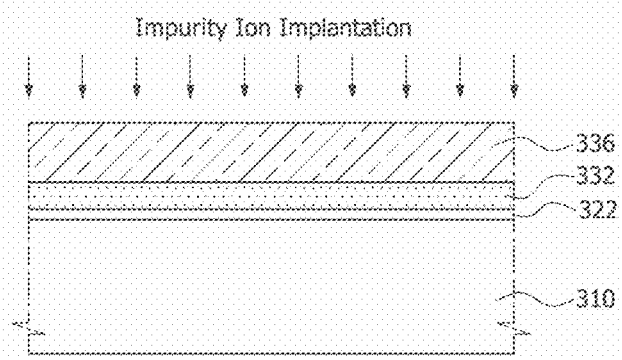

Referring to FIG. 12, impurity ions may be implanted into the first amorphous silicon layer 332 and the polycrystalline silicon layer 336. In an embodiment, the impurity ions may be boron ions. Alternatively, the impurity ions may be N-type impurities, for example, phosphorus ions. The impurity ions may be implanted using an ion implantation process, a plasma doping process or a combination thereof. The impurity ions in the polycrystalline silicon layer 336 may be vigorously diffused therein.

In contrast, the impurity ions in the first amorphous silicon layer 332 may be formed without being diffused therein because of the presence of the anti-diffusion impurities. That is, the anti-diffusion impurities in the first amorphous silicon layer 332 may suppress and/or prevent the impurity ions in the first amorphous silicon layer 332 from being diffused into the polycrystalline silicon layer 336 and the gate insulation layer 322 as well as the substrate 310. Thus, most of the impurity ions in the first amorphous silicon layer 332 may still remain therein even though a subsequent annealing process is performed. Accordingly, although an ion implantation energy and/or an ion implantation dose are increased when the impurity ions are implanted into the first amorphous silicon layer 332 and polycrystalline silicon layer 336, the anti-diffusion impurities may suppress and/or prevent the impurity ions in the first amorphous silicon layer 332 and the polycrystalline silicon layer 336 from penetrating the gate insulation layer 322 during a subsequent annealing process.

Figure 13:
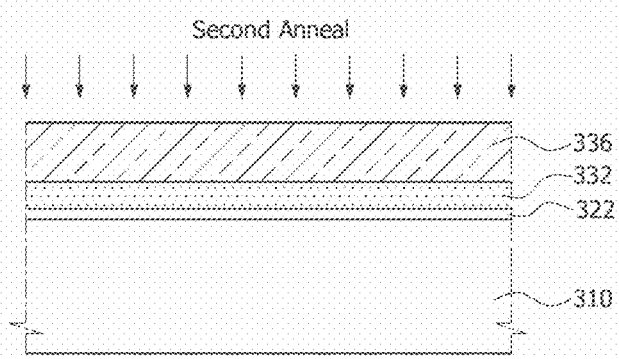

Referring to FIG. 13, a second annealing process may be applied to the substrate where the impurity ions are implanted into the first amorphous silicon layer 332 and the polycrystalline silicon layer 336. The second annealing process may be performed at a temperature of about 900° C. to about 1000° C. As a result of the second annealing process, the impurity ions in the first amorphous silicon layer 332 and the polycrystalline silicon layer 336 are activated. The second annealing process may be performed by sequentially applying a rapid thermal annealing process and a laser annealing process to the substrate where the impurity ions are implanted. The rapid thermal annealing process may sufficiently activate the impurity ions in the polycrystalline silicon layer 336, and the laser annealing process may sufficiently activate the impurity ions in the first amorphous silicon layer 332.

According to a typical method of fabricating a semiconductor device, it may be difficult to inject sufficient amounts of impurity ions into a lower portion of a silicon gate layer because of a penetration phenomenon that may cause the impurity ions to be diffused into a channel region through a gate insulation layer between the silicon gate layer and the channel region. If the impurity ions are not sufficiently injected into the lower portion of a semiconductor gate pattern, an impurity depletion phenomenon may occur in the lower portion of the silicon gate layer. Thus, there may be a limitation in reducing a sheet resistance of the silicon gate layer. However, according to the present embodiment, a sufficient amount of impurity ions may be injected and accumulated in the lower portion (e.g., the first amorphous silicon layer 332) of the semiconductor gate layer, and the impurity ions in the first amorphous silicon layer 332 may be sufficiently activated using the laser annealing process without out-diffusion of the impurity ions. Hence, the sheet resistance of the semiconductor gate layer may be reduced. Accordingly, after the second annealing process is performed, the semiconductor gate layer including the first amorphous silicon layer 332 and the polycrystalline silicon layer 336 may exhibit the same or similar impurity concentration profile to the line plotted by the reference numeral 420 of FIG. 4.

Figure 14:
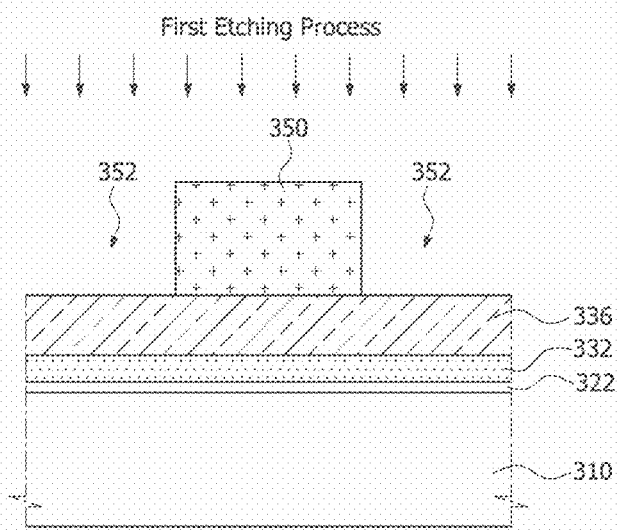

Referring to FIG. 14, a mask pattern 350 may be formed on the polycrystalline silicon layer 336. The mask pattern 350 may be formed of a photoresist layer or a hard mask layer. The hard mask layer may be formed of a material layer having a sufficiently high etch selectivity with respect to the first amorphous silicon layer 332 and the polycrystalline silicon layer 336. The mask pattern 350 may be formed to have an opening 352 that leaves exposed a portion of the polycrystalline silicon layer 336. A first etching process may be then applied to the exposed portion of the polycrystalline silicon layer 336, as indicated by arrows in FIG. 14.

Figure 15:
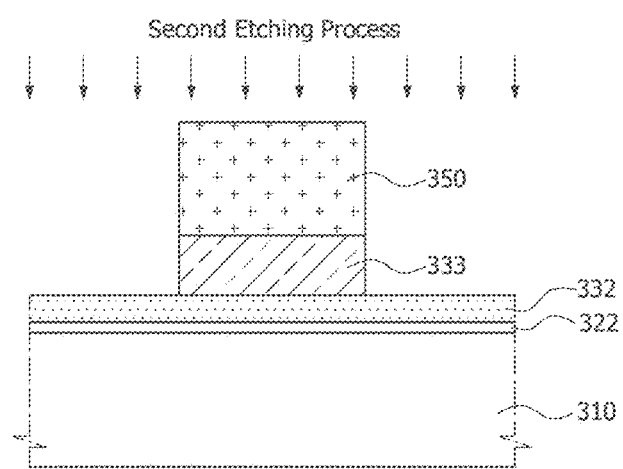

Referring to FIG. 15, as a result of the first etching process, the exposed portion of the polycrystalline silicon layer 336 may be removed to form a polycrystalline silicon pattern 333 that remains under the mask pattern 350 and leaves a portion of the first amorphous silicon layer 332 exposed. Subsequently, a second etching process may be applied to the exposed portion of the first amorphous silicon layer 332, as indicated by arrows in FIG. 15. During the second etching process, the gate insulation layer 322 may also be etched. The second etching process may be performed using an etch recipe that exhibits less etch damage than the first etching process. This is for minimizing the etch damage applied to the substrate 310 during second etching process.

Figure 16:
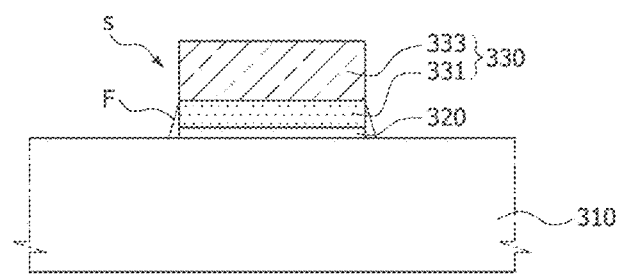

Referring to FIG. 16, as a result of the second etching process, an amorphous silicon pattern 331 and a gate insulation pattern 320 may be formed under the polycrystalline silicon pattern 333. The amorphous silicon pattern 331 and the gate insulation pattern 320 may be formed to have substantially the same width as the polycrystalline silicon pattern 333. The amorphous silicon pattern 331 and the polycrystalline silicon pattern 333 may constitute a semiconductor gate pattern 330, for example, a silicon gate pattern.

The second etching process may apply relatively less etch damage to the substrate 310 as compared with the first etching process, as described above. In this case, an etch rate of the second etching process may be gradually reduced as the etching time elapses, and the amorphous silicon pattern 331 may be formed to have a sloped sidewall profile indicated by dotted lines F. However, according to the present embodiment, the amorphous silicon pattern 331 can be heavily doped with a sufficient amount of impurity ions. Thus, the high impurity concentration of the amorphous silicon pattern 331 may compensate for the low etch rate of the second etching process. Further, an amorphous material may exhibit a relatively high etch rate as compared with a polycrystalline material and a single crystalline material. Accordingly, the crystallographic structure of the amorphous silicon pattern 331 may also compensate for the low etch rate of the second etching process. Consequently, the amorphous silicon pattern 331 may be formed to have substantially a vertical sidewall profile S even though the second etching process is performed using an etch recipe that exhibits less etch damage than the first etching process.

Figure 17:
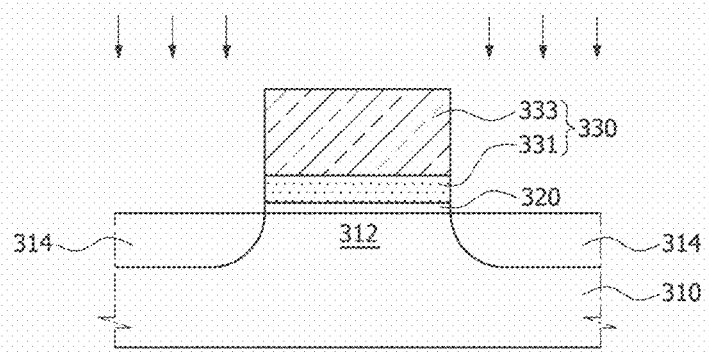

Referring to FIG. 17, an ion implantation process and a drive-in process (e.g., an annealing process) may be applied to the substrate, as indicated by arrows in FIG. 17. As a result of the ion implantation process and the drive-in process, a pair of impurity junction regions such as source/drain regions 314 may be formed in the substrate 310.

Figure 18:
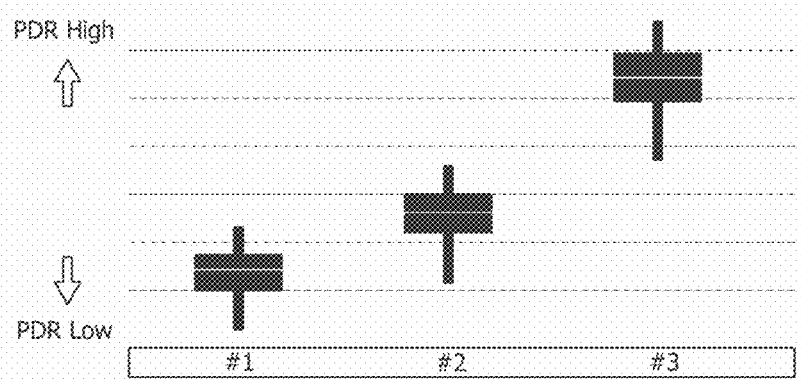
FIG. 18 is a graph illustrating test results of impurity depletion characteristics of silicon gate patterns of MOS transistors according to some example embodiments.

FIG. 18 is a graph illustrating test results of impurity depletion characteristics of silicon gate patterns of MOS transistors according to example embodiments. In FIG. 18, the abscissa represents split groups of test wafers, and the ordinate represents impurity depletion rates of silicon gate patterns. In FIG. 18, the split group indicated by the symbol "#1" was fabricated to include silicon gate patterns having only polycrystalline silicon patterns, and the split groups indicated by the symbols "#2" and "#3" were fabricated to include silicon gate patterns according to the example embodiments described above. That is, each of the silicon gate patterns of the test wafers #2 and #3 was formed to include an amorphous silicon pattern doped with nitrogen atoms (acting as anti-diffusion impurities) and a polycrystalline silicon pattern, as described with reference to FIGS. 9 to 17. The test wafer #3 was doped with higher doping energy than the test wafer #2. Further, impurity ions (acting as carrier impurities) in the amorphous silicon pattern were activated using a laser annealing process. As the test results of FIG. 18 shows, the impurity depletion rates (PDR) of the silicon gate patterns of the test wafers #2 and #3 were higher than the impurity depletion rates (PDR) of the silicon gate patterns of the test wafers #1. Thus the impurity depletion phenomenon may be suppressed more in the test wafer #2 and #3 than in the test wafer #1. Further, the impurity depletion rates (PDR) of the silicon gate patterns of the test wafers #3 were higher than the impurity depletion rates (PDR) of the silicon gate patterns of the test wafers #2.

According to the embodiments set forth above, at least a lower portion of a semiconductor gate pattern adjacent to a gate insulation pattern can be heavily doped with sufficient amounts of impurity ions and anti-diffusion impurities. Thus, an impurity depletion phenomenon that may occur in the semiconductor gate pattern can be suppressed to improve electrical characteristics of a semiconductor device including the semiconductor gate pattern.

Further, the anti-diffusion impurities suppress and/or prevent the impurity ions in the semiconductor gate pattern from being diffused into a substrate through the gate insulation pattern. Thus, the semiconductor device can stably operate.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor device comprising:
a substrate;
a gate insulation pattern on the substrate; and
a semiconductor gate pattern on the gate insulation pattern, the semiconductor gate pattern comprising;
   a first amorphous silicon pattern on the gate insulation pattern, wherein the first amorphous silicon pattern includes first anti-diffusion impurities that suppress diffusion of first impurity ions in the semiconductor gate pattern;
   a first polycrystalline silicon pattern on the first amorphous silicon pattern;
   a second amorphous silicon pattern on the first polycrystalline silicon pattern, wherein the second amorphous silicon pattern includes second anti-diffusion impurities that suppress diffusion of second impurity ions in the semiconductor gate pattern; and
   a second polycrystalline silicon pattern on the second amorphous silicon pattern.

2. The semiconductor device of claim 1, wherein a bottom surface of the first amorphous silicon pattern directly contacts a top surface of the gate insulation pattern, a top surface of the first amorphous silicon pattern directly contacts a bottom surface of the first polycrystalline silicon pattern, a top surface of the first polycrystalline silicon pattern directly contacts a bottom surface of the second amorphous silicon pattern, and a top surface of the second amorphous silicon pattern directly contacts a bottom surface of the second polycrystalline silicon pattern.

3. The semiconductor device of claim 1, wherein the first and second anti-diffusion impurities include nitrogen atoms, carbon atoms, or oxygen atoms.

4. The semiconductor device of claim 1, wherein the anti-diffusion impurities have a meta-stable status.

* * * * *